(12) United States Patent
Leier

(10) Patent No.: US 10,350,540 B2
(45) Date of Patent: Jul. 16, 2019

(54) ADSORBENT ASSEMBLY WITH CUSTOMIZABLE HUMIDITY FOR AN ENCLOSURE

(71) Applicant: Donaldson Company, Inc., Minneapolis, MN (US)

(72) Inventor: Andre D. Leier, Shakopee, MN (US)

(73) Assignee: Donaldson Company, Inc., Minneapolis, MN (US)

( * ) Notice: Subject to any disclaimer, the term of this patent is extended or adjusted under 35 U.S.C. 154(b) by 175 days.

(21) Appl. No.: 15/165,254

(22) Filed: May 26, 2016

(65) Prior Publication Data

US 2016/0353596 A1 Dec. 1, 2016

Related U.S. Application Data

(60) Provisional application No. 62/166,483, filed on May 26, 2015.

(51) Int. Cl.
*B01D 53/02* (2006.01)
*B01D 53/26* (2006.01)
*H05K 5/02* (2006.01)

(52) U.S. Cl.
CPC ......... *B01D 53/261* (2013.01); *H05K 5/0213* (2013.01); *B01D 2253/102* (2013.01); *B01D 2253/106* (2013.01)

(58) Field of Classification Search
CPC ........ B01D 2253/102; B01D 2253/106; B01D 53/261; H05K 5/0213
See application file for complete search history.

(56) References Cited

U.S. PATENT DOCUMENTS

| | | | |
|---|---|---|---|
| 2,994,404 A * | 8/1961 | Schifferly | B01D 53/261 206/0.5 |
| 4,151,690 A | 5/1979 | Schoofs et al. | |
| 4,999,034 A | 3/1991 | Mager et al. | |
| 6,238,467 B1 | 5/2001 | Azarian et al. | |
| 9,149,785 B2 | 10/2015 | Logel et al. | |
| 9,302,795 B1 | 4/2016 | Beatty et al. | |

(Continued)

FOREIGN PATENT DOCUMENTS

| | | |
|---|---|---|
| CA | 2186841 | 2/2000 |
| EP | 2277799 | 2/2012 |

(Continued)

OTHER PUBLICATIONS

"International Preliminary Report on Patentability," for PCT Application No. PCT/US2016/034383 dated Dec. 7, 2017 (6 pages).

(Continued)

*Primary Examiner* — Christopher P Jones
(74) *Attorney, Agent, or Firm* — Mueting, Raasch & Gebhardt, P.A.

(57) ABSTRACT

The currently-described technology relates to a method of constructing an adsorbent assembly. An adsorbent material is enclosed within a housing. The adsorbent material that is enclosed in the housing is dried by allowing moisture to escape the housing through an injection opening defined by the housing. Water is injected into the housing through the injection opening. After injecting water into the housing, the injection opening of the housing is sealed with a substantially vapor-impermeable material. Adsorbent assemblies are also described.

30 Claims, 9 Drawing Sheets

(56) References Cited

U.S. PATENT DOCUMENTS

| | | | |
|---|---|---|---|
| 2002/0134239 | A1 | 9/2002 | Tang et al. |
| 2002/0170437 | A1 | 11/2002 | Deguiseppi et al. |
| 2003/0186004 | A1 | 10/2003 | Koslow et al. |
| 2006/0144733 | A1 | 7/2006 | Wu et al. |
| 2008/0017528 | A1 | 1/2008 | Magargee et al. |
| 2010/0319303 | A1 | 12/2010 | Portier et al. |
| 2011/0017615 | A1 | 1/2011 | Logel et al. |
| 2011/0023717 | A1 | 2/2011 | Itami et al. |
| 2011/0036733 | A1 | 2/2011 | Balthes et al. |
| 2012/0073655 | A1 | 3/2012 | Mori et al. |
| 2012/0145940 | A1 | 6/2012 | Tuma et al. |
| 2013/0156828 | A1 | 6/2013 | Aswania et al. |
| 2014/0116254 | A1 | 5/2014 | Leier et al. |
| 2014/0260985 | A1 | 9/2014 | Akdogan et al. |

FOREIGN PATENT DOCUMENTS

| | | |
|---|---|---|
| EP | 1745845 | 12/2012 |
| WO | 2008135570 | 11/2002 |
| WO | 2009013243 | 3/2009 |
| WO | 2014173776 | 10/2014 |
| WO | 2016191579 | 12/2016 |

OTHER PUBLICATIONS

"International Search Report and Written Opinion," for PCT/US2016/034383 dated Aug. 26, 2016 (8 pages).

* cited by examiner

ADSORBENT ASSEMBLY WITH CUSTOMIZABLE HUMIDITY FOR AN ENCLOSURE

This application is a non-provisional application claiming priority to U.S. Provisional Application No. 62/166,483, filed May 26, 2015, and the entire contents of which is incorporated herein by reference.

FIELD OF THE TECHNOLOGY

The present application is directed to an adsorbent assembly for an enclosure. More particularly, the present application is directed to an adsorbent assembly that has customizable humidity for an electronics enclosure.

BACKGROUND

It is desirable for the interior of many enclosures to be maintained at a controlled humidity. For example, in the context of electronics enclosure, maintaining a low humidity can have the benefit of avoiding corrosion and deterioration of the electronic components caused by water molecules, but maintaining too low humidity in the electronics enclosure can lead to static electricity, which can damage components. As such, it is often desirable to control the humidity within particular relative humidity ranges. For example, in the case of disk drive enclosures, the amount of water vapor within the disk drive enclosure can affect air density, thereby impacting the fly height of read-write heads. In these situations it is desirable to keep a controlled, consistent humidity so that the read-write head height can be kept within specific narrow ranges. This is particularly significant in the context of a sealed enclosure, where the amount of moisture in the adsorbent will be permanently trapped within the enclosure.

Adsorbent assemblies are typically used in enclosures to control humidity, which can contain various adsorbent materials such as silica gel, activated carbon, and the like. However, the mere addition of an adsorbent into a disk drive enclosure (as an example) does not necessarily solve all the water control problems because of various factors such as the manner in which the water is adsorbed and desorbed during the production, storage, and operation of the disk drive. The challenge of controlling humidity within an enclosure is compounded by the variable conditions in which the adsorbent assemblies and the enclosures themselves are manufactured: many manufacturing settings are in relatively open environments where any adsorbent that is present can readily absorb atmospheric moisture. Therefore, a need exists for controlling and maintaining the water content in the adsorbent assembly during manufacturing and handling so that the desired humidity level of the adsorbent assembly and, therefore, the enclosure, can be maintained.

SUMMARY

One embodiment of the current technology relates to a method of constructing an adsorbent assembly. An adsorbent material is enclosed within a housing. The adsorbent material that is enclosed in the housing is dried by allowing moisture to escape the housing through an injection opening defined by the housing. Water is injected into the housing through the injection opening. After injecting water into the housing, the injection opening of the housing is sealed with a substantially vapor-impermeable material. Adsorbent assemblies are also described.

In another embodiment, an adsorbent assembly has a housing that defines a cavity and an injection opening. A first adsorbent material is positioned within a portion of the cavity, and a void volume defined by the housing and the first adsorbent material is adjacent to the injection opening. A first substantially vapor-impermeable material is coupled to the housing to block the injection opening.

Another embodiment of the current technology relates to an adsorbent assembly. A housing defines a cavity and an injection opening and an adsorbent material is positioned within the housing. A membrane is coupled to the housing around the injection opening, where the membrane defines an opening overlapping the injection opening. A first substantially vapor-impermeable material blocks the injection opening.

BRIEF DESCRIPTION OF THE DRAWINGS

The current technology may be more completely understood and appreciated in consideration of the following detailed description of various embodiments of the current technology in connection with the accompanying drawings.

DETAILED DESCRIPTION

Figure 1:
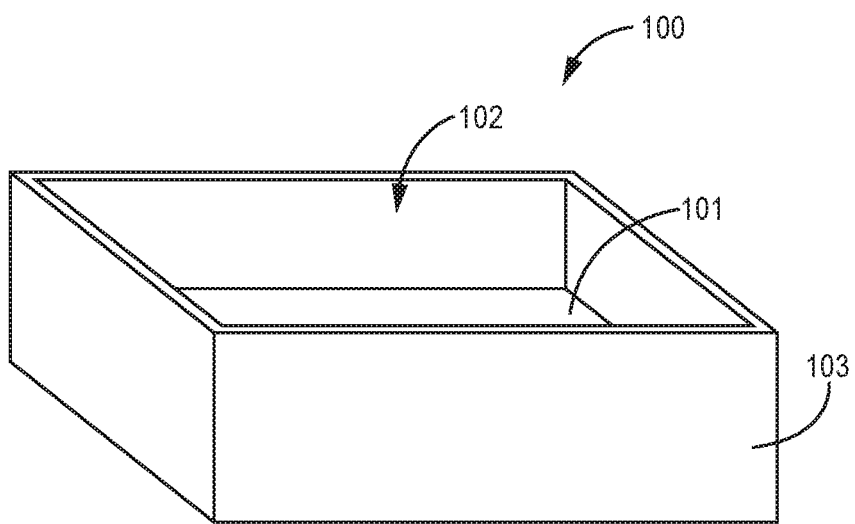
FIG. 1 is a perspective view of an example housing consistent with the technology disclosed herein.

The technology disclosed herein is generally related to an adsorbent assembly and methods of constructing an adsorbent assembly to have a customizable relative humidity. The adsorbent assembly is constructed such that a particular mass of substantially dry adsorbent material and a particular mass of water are sealed within a housing that is substantially moisture vapor impermeable. The amounts of adsorbent material and water within the housing are configured to operate at a defined relative humidity when installed in its intended environment, such as an electronics enclosure or other types of enclosures.

FIGS. 1-6 depict various steps in one example method of constructing an absorbent element consistent with the technology disclosed herein. According to various methods, a housing of the adsorbent assembly is formed, such as a housing 100 depicted in FIG. 1. The housing 100 generally defines a cavity 102. In the current embodiment, the housing 100 has a base surface 101 and at least one sidewall 103 mutually defining the cavity 102. In the currently depicted embodiment four sidewalls 103 are joined to the base surface 101 to define a box having a cavity 102, but in some embodiments the housing can have additional or fewer sidewalls. Configurations are contemplated where the housing defines alternate shapes.

The housing 100 can be constructed through a variety of approaches generally known in the art, and according to one example the housing 100 is injection molded. The housing 100 can be constructed of a variety of materials and combinations of materials. Generally the housing will be constructed of materials that are substantially water vapor impermeable, which is intended to mean that the materials used to construct the housing have a moisture vapor transmission rate of less than 260 grams per square meter per 24 hours per 1 mil thickness at 38 degrees Celsius and 90% relative humidity. In some particular examples, the housing will be constructed of materials that have a moisture vapor transmission rate of less than 100 grams, or even less than 25 grams, per square meter per 24 hour per mil thickness at 38 degrees C. and 90% relative humidity. In some examples, the housing 100 is a plastic such as polycarbonate. In some other examples, the housing 100 is a metal.

Figure 2:
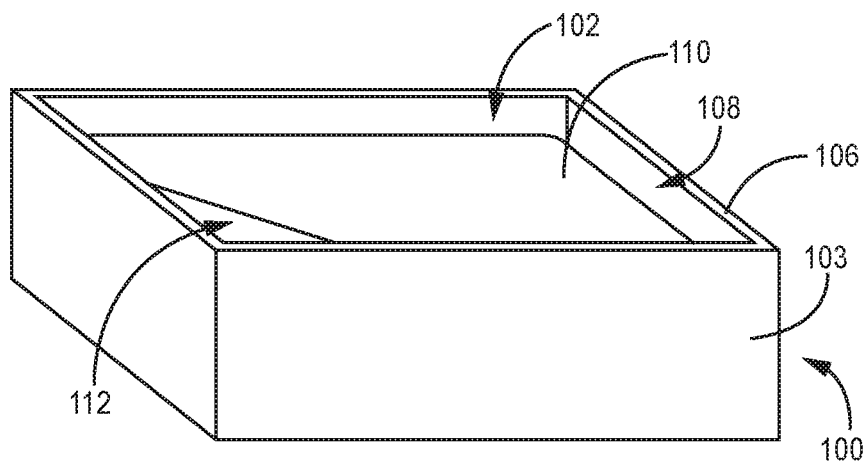
FIG. 2 is a perspective view of an adsorbent positioned in the example housing of FIG. 1.
Figure 3:
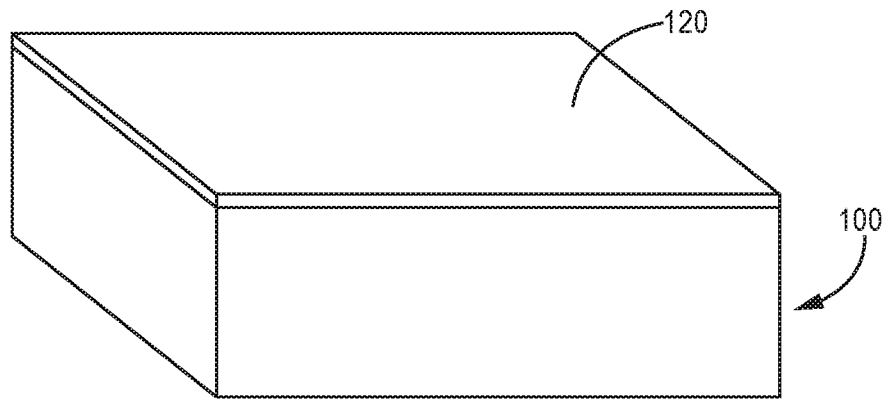
FIG. 3 is a perspective view of the housing with a cover seal consistent with the technology disclosed herein.

According to various methods, an adsorbent material is enclosed in the housing. FIG. 2 depicts an adsorbent material 110 positioned in the cavity 102 defined by the housing 100, and FIG. 3 depicts an adsorbent sub-assembly where a cover seal 120 is coupled to the housing 100, covering the cavity 102, to enclose the adsorbent material 110.

The adsorbent material 110 can be a variety of types of adsorbents and combinations of types of adsorbents. In some implementations described herein the adsorbent material 110 contains silica gel. Example adsorbent materials can contain, for example, molecular sieves and activated carbon. Suitable adsorbent materials can contain combinations of silica gel, molecular sieves, and/or activated carbon. In various examples, the adsorbent material 110 is formed into a compression-molded tablet. Other suitable adsorbent materials can be adsorbent webs, adsorbent beads, adsorbent granulars, powders, other forms of adsorbents, and combinations thereof.

In example embodiments the adsorbent material 110 does not contain silica gel, in the alternative at least 20 percent silica gel, alternatively at least 40 percent silica gel, and optionally at least 80 percent silica gel by weight. In some implementations the adsorbent has less than 20 percent silica gel, alternatively less than 60 percent silica gel, and optionally less than 100 percent silica gel by weight. Suitable adsorbent materials can have, for example, adsorbents containing from 0 to 20 percent silica gel, from 40 to 60 percent silica gel, and alternatively from 80 to 100 percent silica gel by weight.

In example embodiments the adsorbent material 110 has no activated carbon, alternatively at least 20 percent activated carbon and in some example embodiments at least 50 percent activated carbon by weight. In some implementations the adsorbent has less than 20 percent activated carbon, less than 50 percent activated carbon, and less than 100 percent activated carbon by weight. Suitable adsorbent materials can contain, for example, from 0 to 20 percent activated carbon, from 20 to 50 percent activated carbon, and alternatively from 50 to 100 percent activated carbon by weight.

The cover seal 120 is generally constructed of a substantially vapor impermeable material to limit moisture vapor transmission between the adsorbent and the environment outside of the housing 100. A variety of materials can be used to construct the cover seal. As some examples, the cover seal 120 is constructed of a polymeric film or a metal foil. The polymeric material can be a polyolefin, such as polyethylene. Suitable polymeric materials include polypropylene, polyethylene terephthalate, polyethylene, and combinations thereof. In some implementations the polymeric material includes a metal coating to further limit moisture vapor transport through the film. Suitable polymeric films have a thickness of from 0.1 to 1 mils, from 1 to 3 mils, and from 3 to 5 mils, in some embodiments, although thicker films are certainly contemplated.

The cover seal 120 is generally coupled to the housing 100 around the perimeter of the cavity 102. In the current embodiment, the cover seal 120 is coupled to the housing 100 along its edges. The cover seal 120 can be coupled to the housing 100 through a variety of approaches, such as with adhesives, heat or ultrasonic welding, and the like. In some example embodiments, the cover seal 120 is removably sealed to the housing 100. In such embodiments the cover seal 120 can define a manually engageable feature such that, prior to installation of the adsorbent assembly into an enclosure, the cover seal can be removed to enable communication between the cavity and the enclosure for operation of the adsorbent assembly. The manually engageable feature can be a tab, for example.

To the extent that the adsorbent assembly is configured to be installed in an enclosure and the cover seal 120 is, in at least one embodiment, configured to be removed from the housing 100 to enable communication between the cavity and the enclosure, the opening 108 (see FIG. 2) defined by an outer surface 106 of the housing 100 leading to the cavity 102 (which the cover seal 120 extends across) can be referred to as a functional opening 108 of the housing 100 because such an opening is used in the operation of the adsorbent assembly. The functional opening 108 is generally sized to allow sufficient moisture vapor transmission between the cavity 102 and the enclosure, taking into account any filter materials that are disposed between the cavity 102 and the enclosure. In a variety of embodiments, the functional opening 108 is also sized to accommodate installation of the adsorbent material 210.

Figure 4:
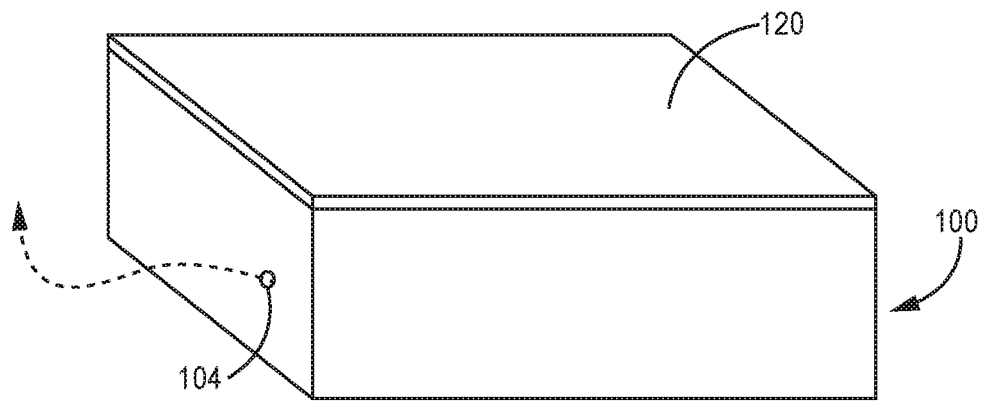
FIG. 4 is a perspective view of a housing defining an injection opening consistent with the technology disclosed herein.

Returning to the discussion of methods of making an adsorbent assembly, in a variety of methods consistent with the current technology, the adsorbent 110 (see FIG. 2) that is enclosed in the cavity 102 between the housing 100 and the cover seal 120 is dried, which is depicted in FIG. 4. An opening 104, which is referred to as an injection opening 104, defined by the housing 100 allows moisture from the adsorbent 110 to escape the housing 100. Drying the adsorbent 110 can be executed through a variety of different approaches. For example, the housing 100 containing the adsorbent 110 can be placed in an oven or other drying environment that encourages moisture to leave the adsorbent. In another example, the housing 100 containing the adsorbent 110 is placed in a vacuum compartment that may or may not be heated. The adsorbent 110 is generally placed in a drying environment until it would be reasonable to expect that a substantial amount of moisture has escaped the adsorbent. The adsorbent 110 can generally be considered dry when the weight of the sub-assembly does not change after a prolonged period in the drying environment.

The specific drying time is generally related to the amount of moisture in the adsorbent 110, the equipment and equipment settings used in the drying process, the mass of adsorbent 110 in the housing 100, the length and diameter of the injection opening 104 in the housing 100, and other factors that will be appreciated. In one example embodiment, where the adsorbent weighs about 1,160 mg and the injection opening 104 is about 1 mm in diameter, the housing 100 holding the adsorbent 110 is dried in a vacuum oven at 60° C. for about 24 hours.

The injection opening 104 is created in the housing 100 prior to the drying of the adsorbent 110. In some embodiments, the injection opening 104 is formed concurrently with formation of the housing 100, such as being formed by a mold used in an injection molding process in creating the housing. In some other embodiments, the housing 100 formed and then the injection opening 104 is formed by puncturing the housing during further manufacturing steps. The term "puncturing" is used to refer to all approaches that can be used to form an injection opening 104 in the housing 100, such as through drilling, punching, piercing, and the like. In at least one embodiment the housing 100 is formed to define perforations about the location of the injection opening, and the injection opening is formed by pressing on the housing within the boundaries of the perforations, thereby removing a portion of the housing, to create the injection opening 104.

Figure 5:
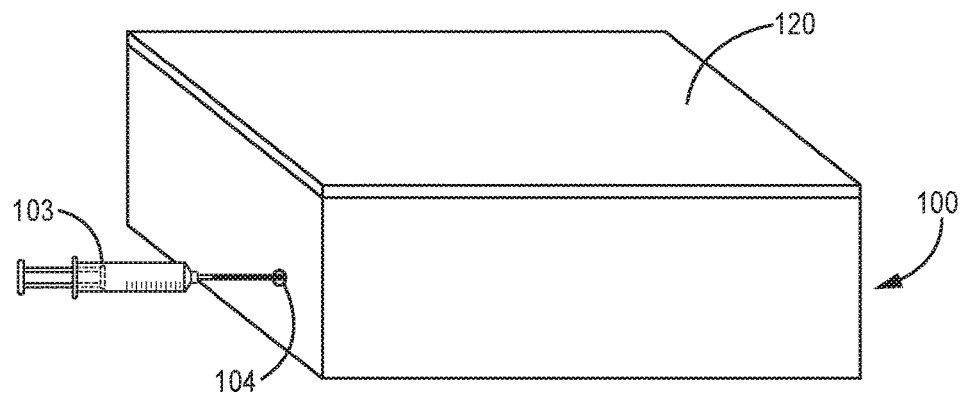
FIG. 5 is a perspective view of an injection nozzle in fluid communication with the injection opening.

After the adsorbent material 120 (FIG. 2) is dried, fluid is injected into the housing 100 through the injection opening 104, which is depicted in FIG. 5. An injector 130 can be inserted through the injection opening 104 defined by the housing to inject the fluid into the housing 100. In some embodiments the injector 130 is positioned to be abutting the injection opening 104 to inject fluid into the housing 100. The injector 130 is generally defined as a component that has the ability to inject fluid into the housing 100 and can be a syringe, needle, pipette, or other device. In a variety of embodiments, the fluid is substantially composed of water or another substance that contains water. The amount of water that is injected into the housing 100 is generally a pre-determined amount that is configured to be adsorbed by the adsorbent material 110 and result in a particular relative humidity when the adsorbent assembly is operating within its intended environment. In some embodiments, a drying step is unnecessary where the water content of the adsorbent is already known, such as where the dry mass of the adsorbent is known and the measured mass of the adsorbent is attributable to water. In such instances the mass of fluid to be injected into the housing 100 can be reduced by the mass of water already adsorbed by the adsorbent 110.

The relative humidity of an adsorbent assembly can be measured and correlated with the water content of the assembly. One test method uses an iButton® Hygrochron Temperature/Humidity Logger from Maxim Integrated, based in San Jose, Calif. A cover seal from a finished adsorbent assembly is removed (as if the adsorbent assembly were to be installed in an enclosure) and the adsorbent assembly and the iButton sensor are sealed in a substantially contained environment at 20° C.-22° C. for 5 days and the relative humidity and temperature data is collected. Relative humidity is determined as the average (within 2 percentage points) once the relative humidity readings from the sensor reach a plateau. While it will be appreciated that the measured relative humidity fluctuates regularly, the relative humidity is understood to plateau when the average value appears to remain relatively constant over an extended period of time, such as over 24 hours or longer.

The amount of water contained by the adsorbent assembly, which can be attributed to the relative humidity measurements, can be calculated by weighing the adsorbent assembly before and after a drying process. In the current example test process, the adsorbent assembly was weighed before testing. After testing, the adsorbent assembly was placed in a vacuum oven until the assembly was substantially dry and weighed again (with the cover assembly that was previously removed for testing). The current test was conducted on an adsorbent assembly consistent with that described with reference to FIG. 12, discussed in detail below. With a first adsorbent material that is silica gel having a mass of about 1,160 mg, injecting 90 mg of water in the housing resulted in about an average 18% relative humidity+/−2%. It is noted that the adsorbent assembly also had a second adsorbent material of activated carbon that had a mass of about 45 mg, which is described in more detail below with reference to FIG. 12.

It will be understood by those having skill in the art that the target relative humidity for construction of an adsorbent assembly can be higher or lower than the intended relative humidity of the adsorbent assembly when installed its particular end-use environment, depending on the further conditions that the adsorbent assembly is expected to be subjected to. For example, if installing the constructed adsorbent assembly in an electronics enclosure will result in subjecting the constructed adsorbent assembly to a relatively high-humidity environment, then the target relative humidity for construction of the adsorbent assembly will be lower than the intended relative humidity of the adsorbent assembly in the electronics enclosure. According to such an example, it would be understood that the adsorbent assembly will likely adsorb some moisture content in the high-humidity environment before installation, resulting in a higher relative humidity once installed in the electronics enclosure.

Figure 16:
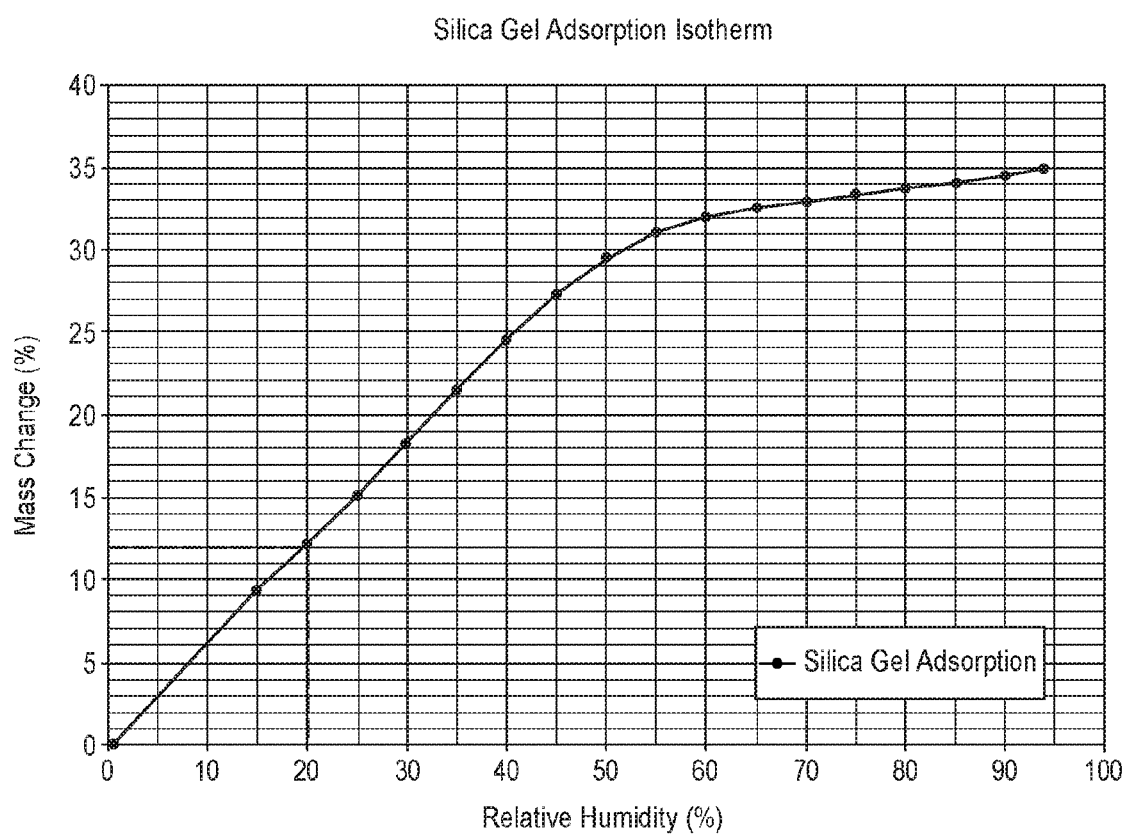
FIG. 16 is an example Silica Gel Water Adsorption Isotherm for reference.

FIG. 16 depicts an example Silica Gel Water Adsorption Isotherm for reference, which relates the relative humidity of an example silica gel to the amount of water adsorbed by the silica gel, where the amount of water adsorbed is expressed as the change in mass of the silica gel. As a specific example reflected in the graph, silica gel that is at a 20% relative humidity adsorbed about 12% of its mass in water, so that 100 mg of silica gel would have adsorbed about 12 mg of water. Stated differently, to bring 100 mg of silica gel to a 20% relative humidity, the silica gel would need to adsorb about 12 mg of water. Specific isotherms for adsorbents will vary based on many factors such as the types of adsorbents and the particular configurations of the adsorbents.

Figure 7:
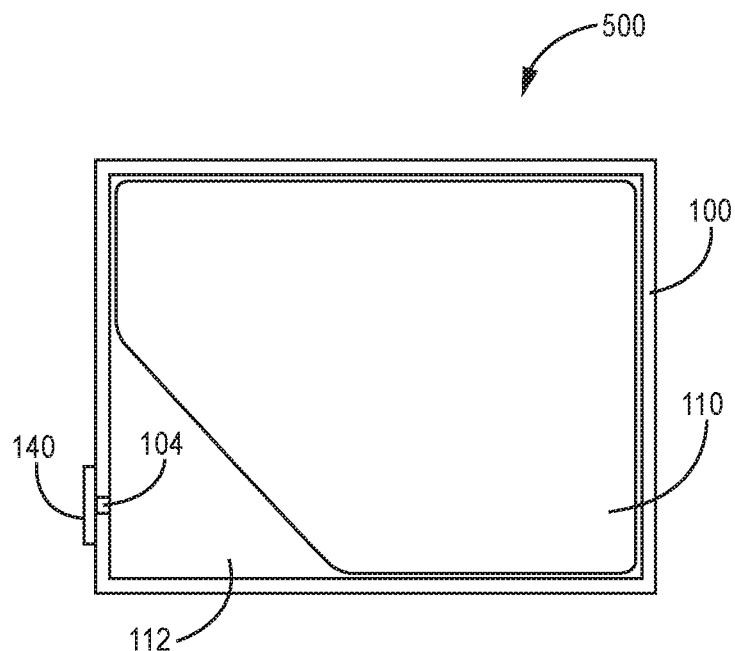
FIG. 7 is a cross-sectional plan view of the adsorbent assembly of FIG. 6.

In a variety of embodiments, the water is injected into a void volume 112 that is mutually defined by the housing 100 and the adsorbent material 110, which is visible in FIGS. 2 and 7, as examples. The void volume 112 is generally adjacent to the injection opening 104. The void volume 112 is generally configured to accommodate a pre-determined volume of water that is configured to be adsorbed by the adsorbent assembly 110. The void volume 112 is generally a cohesive area of the cavity 102 defined among the adsorbent material 110, the housing 100, and the cover seal 120. The void volume 112 can readily accept the injected volume of water, which allows for a relatively rapid injection since the water does not need time to translate to other areas of the cavity within the housing 100.

The injection opening 104 is generally smaller than the opening of the housing cavity 102 that is covered by the cover seal 120. The injection opening 104 is generally sized to balance competing factors such as, for example: (1) minimizing the drying time of the adsorbent 110 during the drying process; (2) limiting the diffusion rate of moisture through the injection opening 104 after drying the adsorbent 110 and after water injection into the housing 100; (3) enabling water injection after drying the adsorbent 110; and (4) preventing the volume of water within the housing 100 from flowing out through the injection opening after having been injected therein.

With regard to the first two factors, the length of the injection opening 104 is also relevant to moisture vapor transmission through the injection opening 104, which depends on the thickness of the housing 100 at the location of the injection opening 104. With regard to the third factor, it can be desirable to have a relatively larger injection opening 104 to facilitate automated manufacturing processes where alignment between the injector and the injection opening 104 is desired. With regard to the fourth factor, a relatively small injection opening 104 combined with the cohesive properties of water, can prevent the water from flowing out of the housing through the injection opening 104.

In embodiments where the adsorbent assembly defines a functional opening 108, such as described above, the injection opening 104 has a smaller cross-sectional area than the functional opening 108. In a variety of embodiments the injection opening 104 has a cross-sectional area of less than 315 mm$^2$. In some embodiments the injection opening has a cross-sectional area of between 0.2 mm$^2$ and 80 mm$^2$. In some more particular examples the injection opening 104 is has a cross-sectional area from 0.8 mm$^2$ to about 20 mm$^2$, from 0.8 mm$^2$ to about 13 mm$^2$, and perhaps from 0.8 mm$^2$ to 3.2 mm$^2$. In some example embodiments the injection opening has a cross-sectional area of less than about 13 mm$^2$. The length of the injection opening 104 can be within a variety of ranges, as well. In some example embodiments, the injection opening 104 has a length less than about 10 mm, less than about 7 mm, less than about 5 mm, or less than about 3 mm. In one particular embodiment the injection opening is about 2.4 mm. Instead of by dimensional measurements, it can be desirable to instead define the injection opening as having a particular diffusion rate. For example, under ambient conditions, it can be desirable for the injection opening 104 to have a diffusion rate of less than 5 mg/hour, less than 3 mg/hour, or even less than 1 mg/hour.

Figure 6:
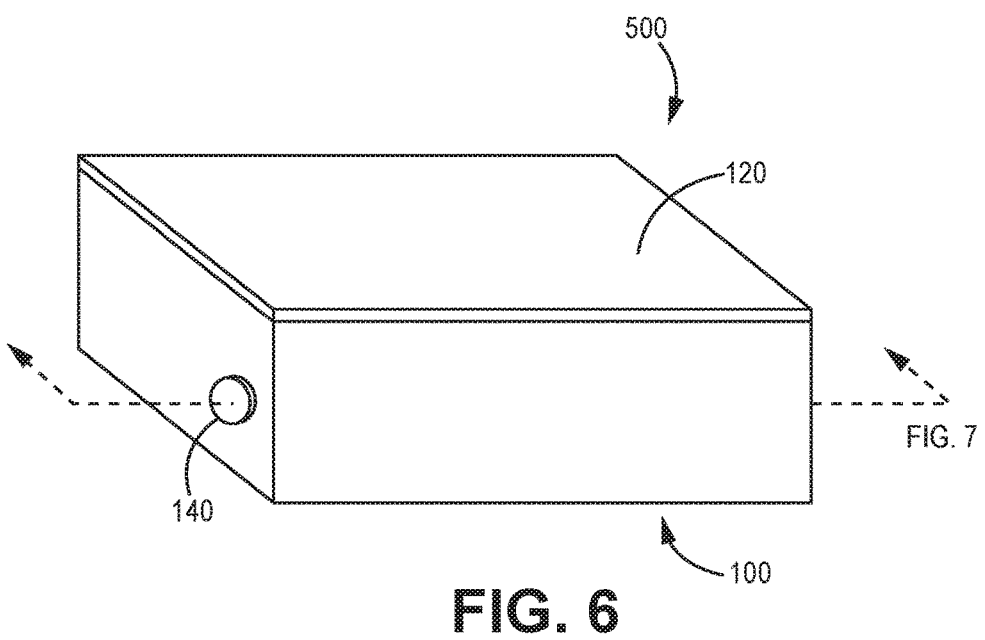
FIG. 6 is a perspective view of an adsorbent assembly consistent with the technology disclosed herein.

After injecting water into the housing 100, the injection opening 104 is sealed with a substantially vapor-impermeable material 140, which is depicted in FIGS. 6 and 7, where FIG. 7 is a cross-sectional view of FIG. 6. The substantially vapor-impermeable material 140 can be a variety of types of materials, such as metals, plastics, polymers, adhesives, and the like. In one embodiment the substantially vapor-impermeable material 140 is a metalized film. In one example embodiment, the injection opening 104 of the housing 100 can be sealed by adhering the substantially vapor-impermeable material 140 to the housing 100 over the injection opening 104. In another example embodiment, the substantially vapor-impermeable material 140 can be a plate of thermoplastic or other material and is welded to the housing 100 over the injection opening 104. In yet another example embodiment, the substantially vapor-impermeable material 140 can be a thermoplastic melt, or adhesive such as epoxy that is disposed on the housing over the injection opening 104 and solidified through means known in the art. The substantially vapor-impermeable material 140 can have moisture vapor transmission rates described above. In one particular example embodiment, the substantially vapor-impermeable material 140 can be removable relative to the housing 100 such that, upon installation in its intended environment (such as an electronics enclosure), the injection opening 104 can operate as a diffusion channel.

Other components and combinations of components can be disposed in the cavity defined by the housing 100 to construct the adsorbent assembly, in a variety of embodiments. As an example, a second adsorbent material can be placed in the housing 100. In some such instances, a barrier material can be positioned between the first adsorbent and the second adsorbent. As another example, a particle filtration material, such as a membrane, can be placed in or coupled to the housing 100 between the adsorbent material(s) and the cover seal 120 to contain particles from the adsorbent material(s) within the cavity 102 of the housing 100. One example embodiment is depicted in FIG. 15, which is a cross sectional profile view of an example adsorbent assembly 1000 that is generally consistent with FIGS. 3-7.

Figure 15:
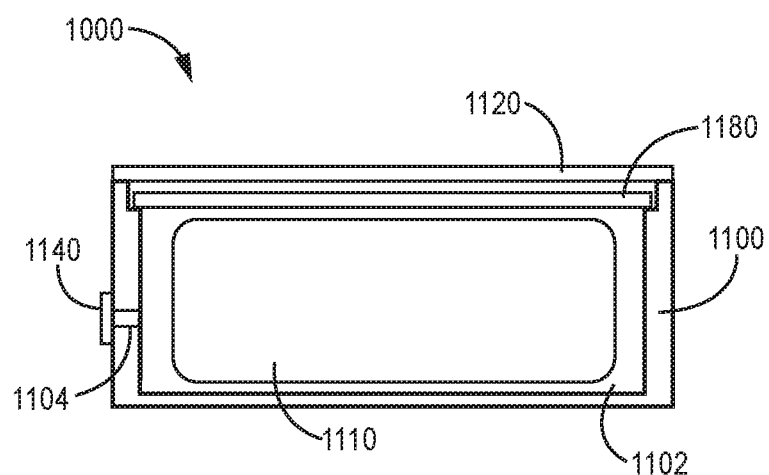
FIG. 15 is a cross-sectional profile view of another example adsorbent assembly consistent with the technology disclosed herein.

The adsorbent assembly 1000 of FIG. 15 has a housing 1100 defining a cavity 1102 and an adsorbent material 1110 disposed within the cavity 1102. A cover seal 1120 is coupled to the housing 1100 to seal the adsorbent material 1110 within the housing 1100 to prevent moisture vapor transmission to the adsorbent material 1110. An injection opening 1104 is defined by the housing 1100, which is sealed with a substantially vapor impermeable material 1140 to prevent vapor transmission through the injection opening 1104. A filter material 1180 is coupled to the housing 1100 between the adsorbent material 1110 and the cover seal 1120 to contain particles of the adsorbent material 1110 within the cavity 1102. The filter material 1180 can be a variety of types of filter materials, and in one embodiment is polytetrafluoroethylene, although other types of filter material 1180 can be used. Materials used for the various components, and component variations, can consistent with those already described herein with reference to other figures. Another embodiment having multiple components disposed within the housing will be described below with reference to FIG. 12, and additional embodiments will also be appreciated by those having skill in the art.

Figure 8:
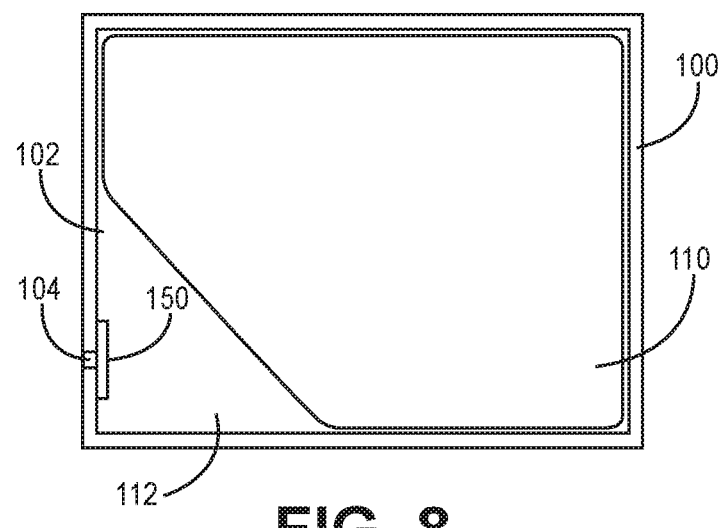
FIG. 8 is a cross-sectional plan view of an alternate adsorbent sub-assembly consistent with the technology disclosed herein.

FIG. 8 depicts a cross sectional view of another example embodiment of an adsorbent sub-assembly consistent with the technology disclosed herein. A housing 100 defines a cavity 102 and an injection opening 104. An adsorbent material 110 is disposed in the housing 100 such that the housing 100 and the adsorbent material 110 mutually define a void volume 112. Additionally, a membrane 150 is disposed in the cavity 102 and coupled to the housing 100 and disposed across the injection opening 104. In the current embodiment, the injection opening 104 is defined by the housing 100 prior to enclosing the adsorbent material 110 within the housing. After coupling a sealing cover to the housing 100 over the cavity 102 (not currently depicted, but as described above with reference to FIG. 3), the adsorbent material is dried, as described above with reference to FIG. 4. During drying, the moisture escapes the housing 100 through the membrane 150 disposed across the injection opening 104.

The membrane 150 can be a variety of materials that can prevent the transfer of particles there-through. In a variety of embodiments the membrane 150 generally allows moisture vapor transmission through the injection opening 104. In multiple embodiments the membrane 150 is polytetrafluoroethylene, although other materials could certainly be used as the membrane 150.

Figure 9:
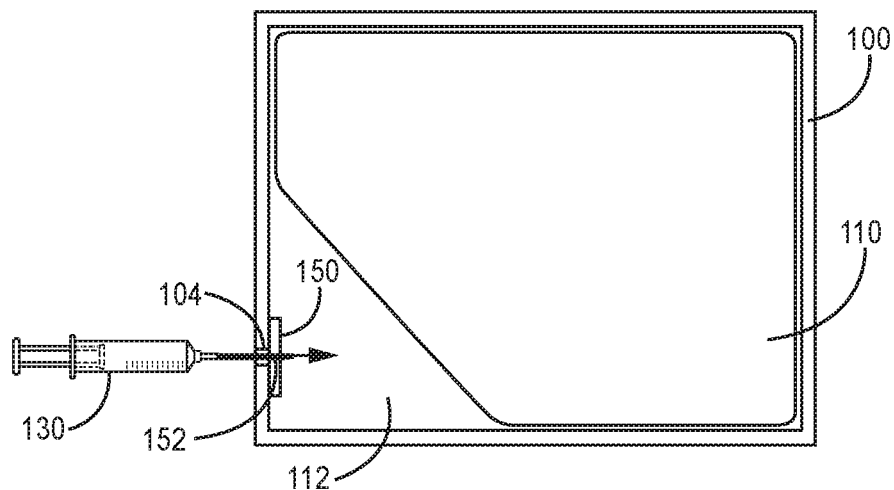
FIG. 9 is a cross-sectional plan view of injecting the adsorbent sub-assembly of FIG. 8, consistent with one example of the technology disclosed herein.

In embodiments where a membrane 150 is disposed in the cavity 102 across the injection opening 104, the membrane 150 can be punctured before or during the step of injecting water into the housing 100, one embodiment of which is depicted in FIG. 9. In such an embodiment the injector 130 itself can puncture the membrane 150 to create a membrane opening 152 that overlaps with the injection opening 104. In another example method, the membrane 150 is punctured with a puncturing tool to create the membrane opening 152 that overlaps with the injection opening 104, and water is injected in the housing 100 through the injection opening 104 and the membrane opening 152.

Figure 10:
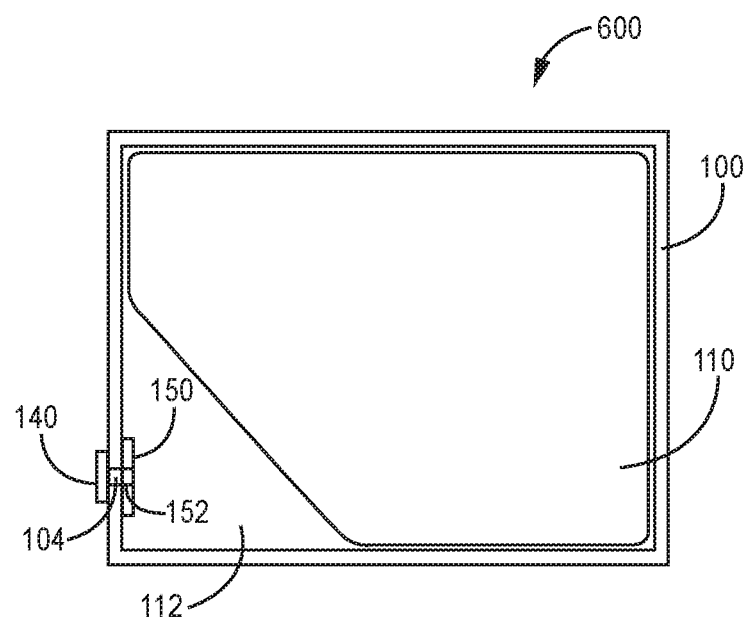
FIG. 10 is a cross-sectional plan view of one example adsorbent assembly consistent with the embodiment depicted in FIG. 9.

After injecting water through the injection opening 104 and the membrane opening 152, a substantially vapor impermeable material is coupled to the housing 100 to block the injection opening 104 to create an adsorbent assembly 600. FIG. 10 is a cross-sectional view of such an example adsorbent assembly 600 constructed through a similar method. The adsorbent assembly 600 has a housing 100 that defines the cavity 102 and an injection opening 104 through a wall of the housing 100. An adsorbent material 110 is positioned within the housing 100. A membrane 150 is coupled to the housing 100 around the injection opening, wherein the membrane defines an opening overlapping the injection opening. A first substantially vapor-impermeable material 140 is coupled to the housing 100, which blocks the injection opening 104 and the membrane opening 152. At least the housing 100 and the adsorbent material 110 define a void volume 112 adjacent to the injection opening 104. In some embodiments the cover seal (not currently depicted, but one example is depicted in FIG. 3) also defines the void volume 112.

Figure 11:
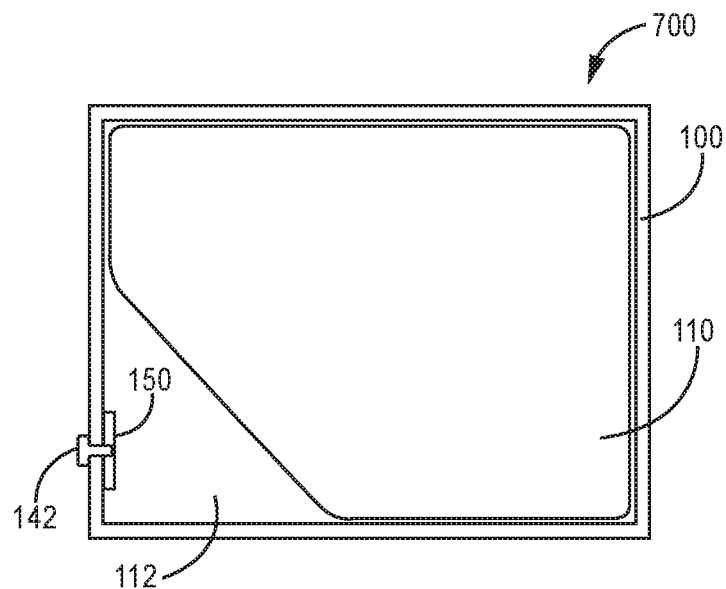
FIG. 11 is a cross-sectional plan view of another example adsorbent assembly consistent with the embodiment depicted in FIG. 9.

FIG. 11 depicts another example embodiment of an adsorbent assembly 700 consistent with the technology disclosed herein. The adsorbent assembly 700 has a housing 100 that defines the cavity 102 and an injection opening 104 through a wall of the housing 100. An adsorbent material 110 is positioned within the housing 100. A membrane 150 is coupled to the housing 100 around the injection opening 104, wherein the membrane 150 defines a membrane opening 152 overlapping the injection opening 104. The housing 100 and the adsorbent material 110 define a void volume 112 adjacent to the injection opening 104. A first substantially vapor-impermeable material 142, which has a different configuration than that depicted in previously-described embodiments, is coupled to the housing 100, which blocks the injection opening 104 and the membrane opening 152. In the current embodiment the first substantially vapor-impermeable material 142 is a plug that is at least partially disposed within the injection opening 104 to seal the injection opening 104. The plug 142 can be constructed of a variety of materials, and in at least one embodiment the plug 142 is an adhesive material that is disposed in or over the injection opening 104 and then hardened. In another embodiment the plug is a screw or one or more other features that plugs the injection opening 104. It is noted that in one example, the membrane 150 can be omitted.

Figure 12:
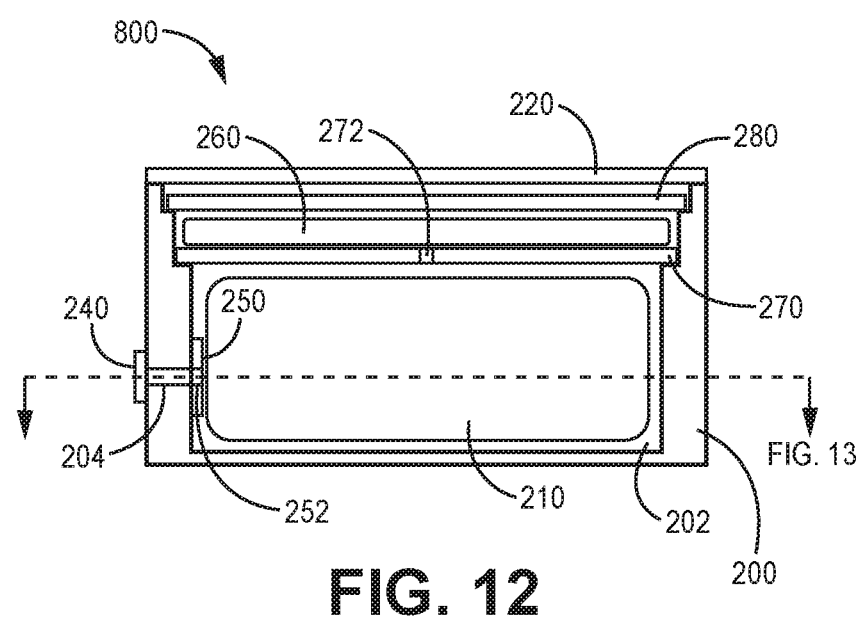
FIG. 12 is a cross-sectional profile view of yet another example adsorbent assembly consistent with the technology disclosed herein.
Figure 13:
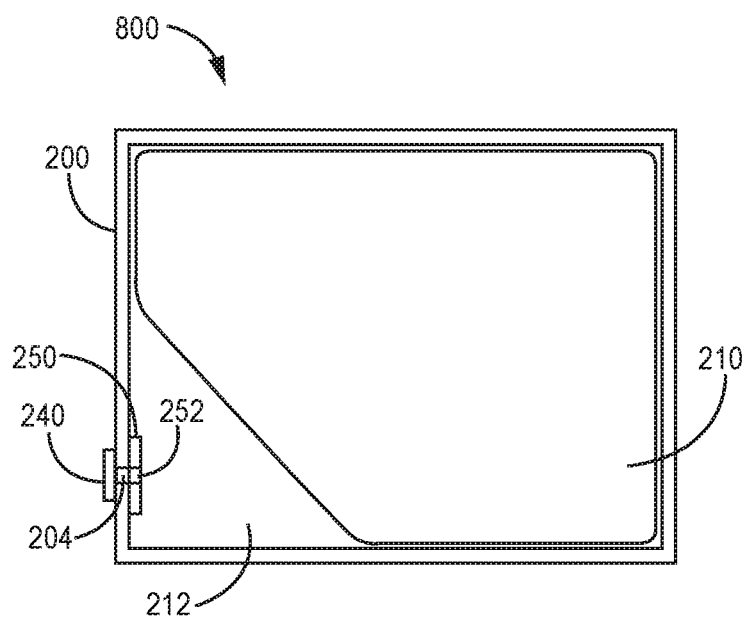
FIG. 13 is a cross-sectional view of the example adsorbent assembly of FIG. 12.

FIG. 12 depicts a cross-sectional profile view of another example embodiment of an adsorbent assembly 800 consistent with the technology disclosed herein, and FIG. 13 depicts a cross-sectional plan view of the example embodiment of FIG. 12. The adsorbent assembly 800 has a housing 200 that defines the cavity 202 and an injection opening 204 through a wall of the housing 200. A first adsorbent material 210 is positioned within the housing 200. A membrane 250 is coupled to the housing 200 around the injection opening 204, wherein the membrane 250 defines a membrane opening 252 overlapping the injection opening 204. In some embodiments the membrane is omitted, as will be appreciated. The housing 200 and the adsorbent material 210 define a void volume 212 adjacent to the injection opening 204. A first substantially vapor-impermeable material 240 is coupled to the housing 200, which blocks the injection opening 204 and the membrane opening 252. A cover seal 220, is coupled to the housing 200 and covering the cavity 202. In the current embodiment the cover seal 220 configured to be removed at the time of installation in an enclosure for operation of the adsorbent assembly 800. Materials used for the various components, and component variations, can be consistent with those already described herein with reference to other figures.

The adsorbent assembly 800 also has a barrier layer 270, which is a second substantially vapor-impermeable material, coupled to the housing 100 and a second adsorbent material 260 positioned in the cavity 202. The second adsorbent material 260 is positioned opposite the first adsorbent material 210 relative to the barrier layer 270. The second adsorbent material 260 can comprise a variety of types of adsorbent materials, similar to that described above with reference to the adsorbent material depicted in FIG. 2. In some embodiments the second adsorbent material 260 is a different type of material than the first adsorbent material 210. In some embodiments, the second adsorbent material 260 is primarily activated carbon and the first adsorbent material 210 is primarily silica gel. In some such embodiments, the second adsorbent material 260 is a layer of activated carbon web. In one particular example embodiment, the second adsorbent material 260 is a 0.25 mm thick layer of powdered activated carbon and polytetrafluoroethylene composite that is compressed into a sheet.

The barrier layer 270 can define one or more openings 272 to allow limited moisture vapor passage to the first adsorbent material 210. The barrier layer 270 can be a polymeric cover. A filter material 280 is coupled to the housing 200 to contain the first adsorbent material 210 and the second adsorbent material 260. The filter material 280 can be a variety of different types of particulate filter material, and in one embodiment is polytetrafluoroethylene. The filter material 280 can be configured, for example, to prevent particulates from the adsorbent materials 210, 260 from leaving the housing 200. The filter material 280 can be coupled to the housing 200 through a variety of means known in the art, such as heat welding, ultrasonic welding, adhesives, and the like.

Figure 14:
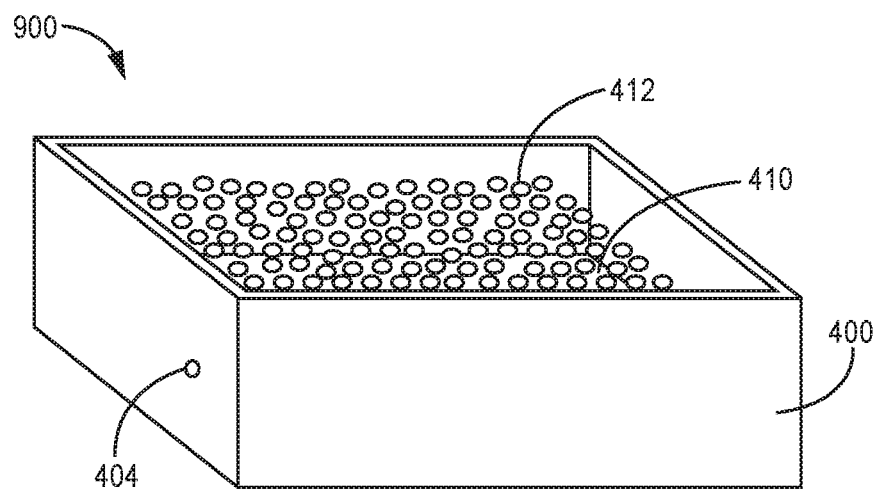
FIG. 14 is a perspective view of an adsorbent sub-assembly consistent with the technology disclosed herein.

FIG. 14 depicts a perspective view of an example adsorbent sub-assembly 900 consistent with the technology disclosed herein. In this embodiment the adsorbent material 410 are loose beads, particulates, or the like, that are disposed in a housing 400. In such an embodiment, the adsorbent material 410 and the housing 400 can be characterized as defining a void volume 412 adjacent to the injection opening 404 because the specific position of the adsorbent material 410 can be changed depending on the orientation of the housing 400. As such, the housing 400 can be positioned such that the housing 400 and the adsorbent beads 410 define a void volume 412 adjacent to the injection opening 404. The example adsorbent sub-assembly 900 can be used to construct adsorbent assemblies consistent with the technology disclosed herein, using materials, components, and component variations described herein.

It should also be noted that, as used in this specification and the appended claims, the phrase "configured" describes a system, apparatus, or other structure that is constructed or configured to perform a particular task or adopt a particular configuration. The phrase "configured" can be used interchangeably with other similar phrases such as "arranged", "arranged and configured", "constructed and arranged", "constructed", "manufactured and arranged", and the like.

All publications and patent applications in this specification are indicative of the level of ordinary skill in the art to which the present technology pertains. All publications and patent applications are herein incorporated by reference to the same extent as if each individual publication or patent application was specifically and individually indicated by reference.

This application is intended to cover adaptations or variations of the present subject matter. It is to be understood that the above description is intended to be illustrative, and not restrictive.

I claim:

1. An adsorbent assembly comprising:
   a housing defining a cavity, an injection opening, and an outer surface defining a functional opening leading to the cavity;
   a first adsorbent material positioned within a portion of the cavity;
   a void volume adjacent to the injection opening, wherein the void volume is defined by the housing;
   a first substantially vapor-impermeable material blocking the injection opening and coupled to the housing;
   a removable cover seal coupled to the housing across the functional opening wherein the removable cover seal comprises a manually engageable tab, and wherein the injection opening has an area that is less than the area of the functional opening; and
   a filter material adhered to the housing between the adsorbent material and the cover seal.

2. The adsorbent assembly of claim 1, further comprising a membrane coupled to the housing around the injection opening, wherein the membrane defines an opening overlapping the injection opening.

3. The adsorbent assembly of claim 1, further comprising a second substantially vapor-impermeable material coupled to the housing and covering the cavity.

4. The adsorbent assembly of claim 3, wherein the second substantially vapor-impermeable material comprises polycarbonate.

5. The adsorbent assembly of claim 3, further comprising a second adsorbent material positioned in the cavity, wherein the second adsorbent material is positioned opposite the first adsorbent material relative to the second substantially vapor-impermeable material.

6. The adsorbent assembly of claim 1, wherein the void volume is configured to accommodate a pre-determined volume of liquid water to be adsorbed by the adsorbent material.

7. The adsorbent assembly of claim 1, wherein the housing comprises polycarbonate.

8. The adsorbent assembly of claim 1, wherein the first substantially vapor-impermeable material comprises a metalized film.

9. The adsorbent assembly of claim 1, wherein the first substantially vapor-impermeable material comprises a thermoplastic plug.

10. The adsorbent assembly of claim 1, wherein the first substantially vapor-impermeable material comprises an adhesive.

11. The adsorbent assembly of claim 1, wherein the injection opening has a diffusion rate of less than 5 mg/hour under ambient conditions.

12. The adsorbent assembly of claim 1, wherein the void volume is further defined by the adsorbent.

13. The adsorbent assembly of claim 1, wherein the injection opening has a cross-sectional area of less than about 13 $mm^2$.

14. The adsorbent assembly of claim 1, wherein the injection opening has a length of less than 3 mm.

15. A method of constructing an adsorbent assembly comprising:
    enclosing adsorbent material within a portion of a cavity defined by a housing;
    drying the adsorbent material that is enclosed in the housing comprising allowing moisture to escape the housing through an injection opening defined by the housing;
    injecting water into the housing through the injection opening, wherein the water is injected into a void volume defined by the housing, wherein the void volume is adjacent to the injection opening; and
    after injecting water into the housing, sealing the injection opening of the housing with a substantially vapor-impermeable material coupled to the housing, wherein enclosing adsorbent material within the housing comprises:
        coupling a removable cover seal to the housing across a functional opening defined by an outer surface of the housing, wherein the injection opening has a smaller area than the functional opening, and wherein the removable cover seal comprises a manually engageable tab; and
        adhering a filter material to the housing between the adsorbent material and the cover seal.

16. The method of claim 15, wherein allowing moisture to escape comprises puncturing a portion of the housing to create an injection opening.

17. The method of claim 15, wherein the injection opening is defined by the housing prior to enclosing the adsorbent material within the housing.

18. The method of claim 15, wherein injecting water into the housing comprises puncturing a membrane disposed across the injection opening defined by the housing.

19. The method of claim 18, wherein moisture escapes the housing through the membrane disposed across the injection opening.

20. The method of claim 15, wherein injecting water into the housing comprises inserting an injector through the injection opening.

21. The method of claim 15, wherein injecting water into the housing comprises injecting the water into a void volume mutually defined by the housing and the adsorbent material, wherein the void volume is adjacent to the injection opening.

22. The method of claim 15, wherein sealing the injection opening of the housing with a substantially vapor-impermeable material comprises adhering a metalized film over the injection opening.

23. The method of claim 15, wherein sealing the injection opening of the housing with a substantially vapor-impermeable material comprises welding a plate of thermoplastic material over the opening.

24. The method of claim 15, wherein sealing the injection opening of the housing with a substantially vapor-impermeable material comprises plugging the injecting opening with an adhesive.

25. The method of claim 15, wherein the injection opening has a diffusion rate of less than 5 mg/hour under ambient conditions.

26. The method of claim 15, wherein the void volume is defined by the housing.

27. The method of claim 26, wherein the void volume is further defined by the adsorbent.

28. The method of claim 15, wherein the void volume is configured to accommodate a pre-determined volume of liquid water to be adsorbed by the adsorbent material.

29. The method of claim 15, wherein the injection opening has a cross-sectional area of less than about 13 $mm^2$.

30. The method of claim 15, wherein the injection opening has a length of less than 3 mm.

* * * * *